United States Patent [19]
Lim et al.

[11] Patent Number: 5,214,605
[45] Date of Patent: May 25, 1993

[54] AUTOMATIC ERASING OPTIMIZATION CIRCUIT FOR AN ELECTRICALLY ERASABLE AND PROGRAMMABLE SEMICONDUCTOR MEMORY AND METHOD THEREOF

[75] Inventors: Hyeong-Gyu Lim; Wung-Moo Lee, both of Seoul, Rep. of Korea

[73] Assignee: Samsung Electronics Co., Ltd., Suwon, Rep. of Korea

[21] Appl. No.: 636,215

[22] Filed: Dec. 31, 1990

[30] Foreign Application Priority Data

Aug. 20, 1990 [KR] Rep. of Korea .......... 1990-12816[U]

[51] Int. Cl.$^5$ .................................................. G11C 7/00
[52] U.S. Cl. ................. 365/218; 365/189.09; 365/230.06
[58] Field of Search ............. 365/218, 230.06, 189.05, 365/239, 189.09

[56] References Cited

U.S. PATENT DOCUMENTS

| | | | |
|---|---|---|---|
| 4,408,306 | 10/1983 | Kuo | 365/218 |
| 4,460,982 | 7/1984 | Gee et al. | 365/218 |
| 4,648,076 | 3/1987 | Schrenk | 365/218 X |
| 4,888,738 | 12/1989 | Wong et al. | 365/218 |
| 4,977,543 | 12/1990 | Kouzi | 365/218 |
| 5,051,953 | 9/1991 | Kitazawa et al. | 365/185 |

FOREIGN PATENT DOCUMENTS

| | | | |
|---|---|---|---|
| 0376285 | 7/1990 | European Pat. Off. | 365/218 |
| 0419260 | 3/1991 | European Pat. Off. | 365/218 |
| 0249199 | 10/1990 | Japan | 365/218 |
| 0276095 | 11/1990 | Japan | 365/218 |

*Primary Examiner*—Eugene R. LaRoche
*Assistant Examiner*—Son Dinh
*Attorney, Agent, or Firm*—Robert E. Bushnell

[57] ABSTRACT

There is provided an automatic erasing optimization circuit for an flash-type EEPROM including an erase sense means connected between the column decoder and the data input/output buffer for sensing the output state of the column decoder in response to a write enable signal and erasing signal to generate signals of opposite logics, a sequential output means consisting of a first, second and third resistors connected in series and receiving the output signals of the erasing sense means to respectively generate a first, second and third high voltage level control signals, a high voltage generating circuit for generating a high voltage equal to or greater than a given level to both the row decoder and the program latch circuit in response to pump clock pulses and the first, second and third high voltage level control signals, and an address counter for supplying the address buffer with address counting counting clock pulses in response to the output signal of the erasing sense means.

35 Claims, 7 Drawing Sheets

AUTOMATIC ERASING OPTIMIZATION CIRCUIT FOR AN ELECTRICALLY ERASABLE AND PROGRAMMABLE SEMICONDUCTOR MEMORY AND METHOD THEREOF

BACKGROUND OF THE INVENTION

The present invention concerns an erasing circuit for an electrically erasable and programmable semiconductor memory (hereinafter referred to as "EEPROM") and a method thereof, particularly an automatic erasing optimization circuit for sensing and optimizing the erasing state of the memory cell in a selected page of a flash-type EEPROM, and a method thereof.

Generally, the first non-volatile memory device for storing data is an EPROM in which the data is electrically programmed and erased by ultraviolet light. Hence, whenever the program presently stored in the EPROM is changed with another, the memory device must be removed from the system containing it and exposed to ultraviolet light to erase the presently stored program, so that this procedure may take much time.

Moreover, although there has been developed an electrically erasable and programmable read only memory (EEPROM), each of the memory cells of the EEPROM requires two transistors, one of which is a selection transistor to select a memory cell according to an address, and the other which is to read out the data stored in the selected memory cell, so that it is difficult to achieve a high integrated memory array with a large storage capacity.

In order to resolve the problems consisting in the production of a high integrated memory array with a large storage capacity, there was introduced a flash-type EEPROM that may be erased in a single operation, disclosed in the pages 616-619, International Electron Device Meeting published by IEEE, and in U.S. Pat. No. 4,698,787 issued in 1984. A single memory cell of the flash-type EEPROM includes a floating-gate field-effect transistor in which a floating-gate and a control gate are stacked with a thin tunnel oxide interposed between the floating gate and the channel. In such a memory cell, the programming is achieved by applying a high voltage of 12 V-15 V to the control gate and a high voltage of 6 V-7 V to the drain region so as to cause hot electrons generated in the channel region to tunnel into the floating-gate to form a high threshold voltage state of 6 V-10 V. On the other hand, the erasing is achieved by applying a high voltage of 12 V-14 V to the source region so as to cause electrons to pass from the floating-gate to the source region by Fowler-Nordheim tunneling effect to form a high threshold voltage of 0.1 V-1.2 V. In the erasing, as shown in FIG. 5b of the above U.S. Patent, the sources of the memory cells are connected with a common source line supplied with an erasing voltage of high level.

In this case, there is needed an additional source voltage supply for generating a high voltage in order to produce hot carriers in the channel for programming. Further, since erasing is performed through the source diffusion layer, if the source diffusion layer is separately divided, only the cell in a specified block may be erased, but in order to confirm whether the cell is properly erased or overerased, it is necessary to perform a special program for confirming the erasing when externally programming on the circuit board to the chip.

The other type of the flash-type EEPROM is disclosed in the pages 33-34 of Symposium of VLSI Technology, 1988. This EEPROM is a NAND type, wherein a single memory string includes eight cell transistors commonly occupying the bit lines and a ground line. Hence, this is advantageous for integration, and a single power source is used to program, erase and read out the memory with low power consumption because of tunneling effect, namely, Fowler-Nordheim tunneling effect by a high voltage through the thin dielectric layer (or tunnel oxide) between the drain and floating-gate. However, when a high voltage of about 13 V is applied to word lines in order to erase the memory, if one of the memory cells in the memory string is exceedingly erased thus having a high threshold voltage, the current flowing in the memory cell having the high threshold voltage prevents the current flowing in the memory string when reading out another cell in the memory string. This results from the fact that the cell transistors in the NAND-type EEPROM are connected in series. Consequently, when reading out another cell in the string, the cell having the high threshold voltage due to the excessive erasing causes the speed of the reading out to be slowed down, or in the worst case even to misapprehend all the cells in the string for being erased.

SUMMARY OF THE INVENTION

It is an object of the present invention to provide an automatic erasing optimization circuit for optimizing the erasing state of a flash-type EEPROM.

It is another object of the present invention to provide a circuit for testing the state of each memory cell after erasing a flash-type EEPROM.

It is a further object of the present invention to provide a method for optimizing the erasing state of a flash-type EEPROM.

It is still another object of the present invention to provide a flash-type EEPROM with an optimum erasing state.

According to the present invention, in an electrically erasable and programmable semiconductor memory having a memory cell array containing a plurality of word lines, a plurality of bit lines and a plurality of memory cells connected to the word and bit lines, a row decoder connected to the bit lines, a column decoder connected to the word lines, an address buffer for supplying the row and column decoders with external address signals, a data input/output buffer, and a program latch circuit for supplying the bit lines of the memory cell array with a program voltage of high level, an automatic erasing optimization circuit includes an erasing sensor connected between the column decoder and the data input/output buffer for sensing the output state of the column decoder in response to a write enable signal and erasing signal to generate signals of reverse logics, a sequential output circuit consisting of a first, second and third registers connected in series and receiving the output signals of the erasing sensor to respectively generate a first, second and third high voltage level control signals, a high voltage generating circuit for generating a high voltage equal to or greater than a given level to both the row decoder and the program latch circuit in response to pump clock pulses and the first, second and third high voltage level control signals, and an address counter for supplying the address buffer with address counting clock pulses in response to the output signal of the erasing sense circuit.

Preferably, the inventive EEPROM further includes an address buffer having a first gate circuit for receiving address counting clock pulses, a second gate circuit for receiving an external address signal and a switching circuit for controlling the switching of the first and second gate circuits in response to the erasing sense signal, an erasing sensor connected to the sense amplifier of the memory cell array for controlling the address counting clock pulses and generating the erasing sense signal, and a column decoder connected between the column lines of the memory cell array and the erasing sensor, the column decoder being controlled by the address counting clock pulses outputted through the address buffer.

According to another aspect of the present invention, in an automatic erasing optimization circuit for an electrically erasable and programmable semiconductor memory having a memory cell array containing a plurality of word lines, a plurality of bit lines and a plurality of memory cells connected to the word and bit lines, a row decoder connected to the bit lines, a column decoder connected to the word lines, an address buffer for supplying the row and column decoders with external address signals, a data input/output buffer, and a sense amplifying circuit for sensing and amplifying the output voltage of the column decoder in response to the write enable signal and erasing signal to generate an output to the data input/output buffer, the automatic erasing circuit including an erasing sensor for sensing the output of the sense amplifying circuit and the erasing signal to generate an erasing sense signal, a sequential output circuit for receiving the erasing sense signal to sequentially generate a first, second and third high voltage level control signals, a high voltage generating circuit for generating a high voltage equal to or greater than a given level to the row decoder in response to the first, second and third high voltage level control signals, and an address counter for supplying the address buffer with address counting clock pulses in response to the erasing sense signal, and the address buffer including a first gate circuit for receiving the address counting clock pulses, a second gate circuit for receiving an external address signal, and switching circuit for controlling the switching of the first and second gate circuits in response to the erasing sense signal, an automatic erasing optimization method includes the steps of erasing the data stored in a selected memory cell, sensing the erasing state of the memory cells by applying the output of the address buffer responding to the address counting clock pulses to the column decoder during the erasing signal and erasing sense signal being respectively disabled and enabled, and sequentially providing the first, second and third high voltage level control signals to the high voltage generating circuit according to the erasing sense signal received, the steps being successively repeated.

According to a further aspect of the present invention, the inventive flash-type EEPROM includes a memory cell array containing a plurality of word lines, a plurality of bit lines and a plurality of memory cells connected to &:he word and bit lines, a row decoder connected to the bit lines of the memory, an address buffer for receiving external address signals, a column decoder including a plurality of column selection transistors with the channels connected to the word lines of the memory cell array and the gates connected to the output of the address buffer, a data input/output buffer, a sense amplifying circuit for sensing and amplifying the output voltage of the column decoder through the channels of the column selection transistors in response to the write enable signal and erasing signal to generate an output to the data input/output buffer, an erasing sensor including a circuit for delaying and shaping the output of the sense amplifying circuit, a circuit for gating the delayed and shaped signal in response to erasing signal, and a circuit for latching the gated signal in response to the erasing signal, a sequential output circuit including a first, second and third shift registers connected in series to respectively generate a first, second and third high voltage level control signals in response to the erasing sense signal, a high voltage generating circuit for generating a high voltage equal to or greater than a given level to the row decoder in response to pump clock pulses and the first, second and third high voltage level control signals, and an address counter for providing address counting clock pulses to the address buffer in response to the erasing sense signal, the address buffer including a first gate circuit for receiving the address counting clock pulses, a second gate circuit for receiving an external address signal, and a circuit for controlling the switching of the first and second gate circuits in response to the erasing sense signal.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF CERTAIN PREFERRED EMBODIMENTS

Figure 1:
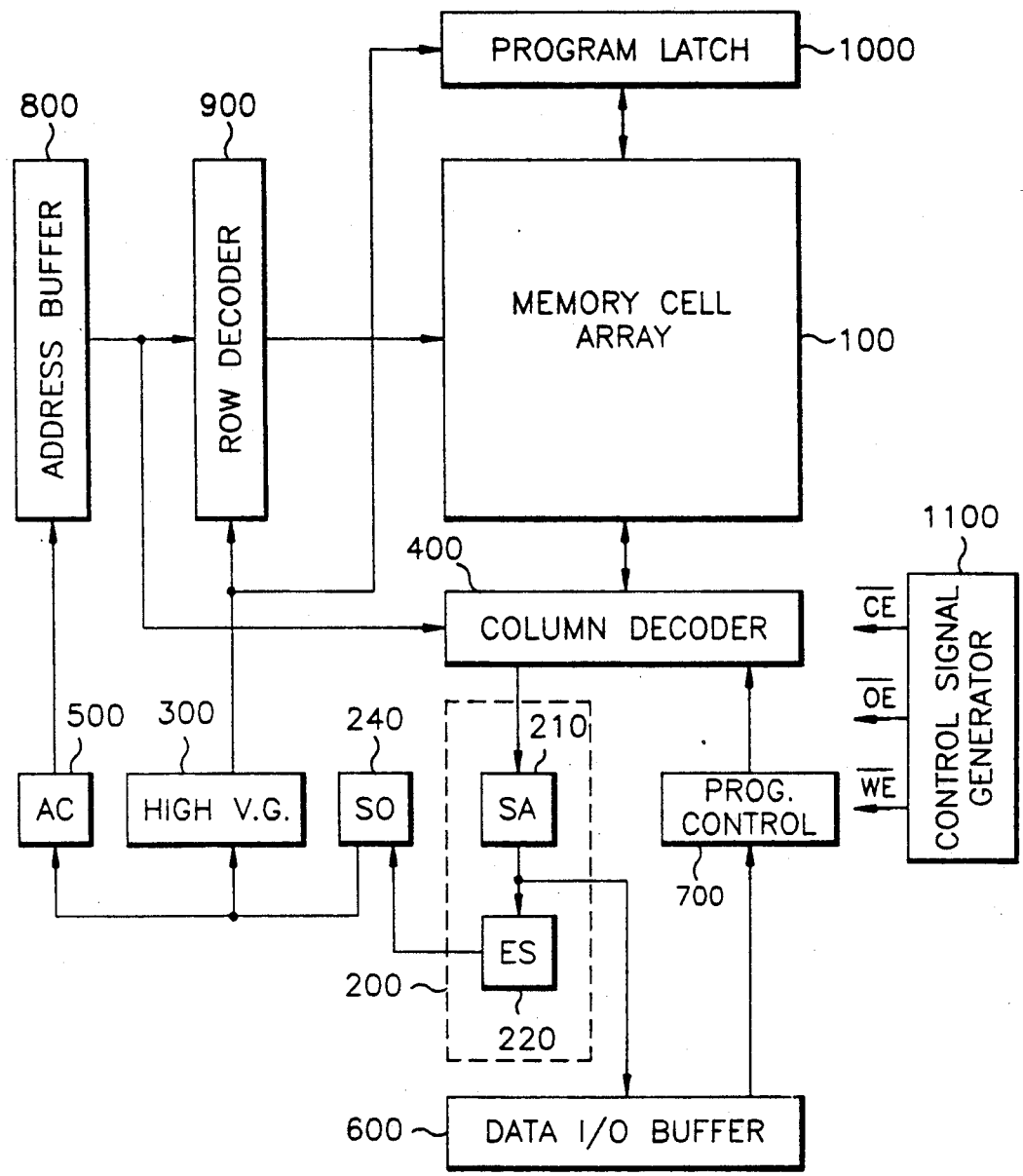
FIG. 1 is a block diagram for illustrating the inventive EEPROM.

Referring to FIG. 1, an EEPROM includes a memory cell array 100 connected to a row decoder 900 and a column decoder 400. A program latch circuit 1000 latches the data transmitted during programming to deliver it to the bit lines of the memory cell array 100. A control signal generating circuit 1100 is to logically combine chip enable signal $\overline{CE}$, output enable signal $\overline{OE}$ and write enable signal $\overline{WE}$ so as to generate a signal for selecting the modes of the system. A program control circuit 700 is interposed between data input/output buffer 600 and the column decoder 400 controlling the externally inputted data. A sense amplifying circuit 210 is connected between the data input/output buffer 600 and the column decoder 400 in order to sense the state of the memory cells when reading out or testing the erasing of the memory cells. An erasing sensor 220 receives the output of the sense amplifying circuit 210 so as to generate an erasing sense signal to distinguish whether a memory cell is erased or not. A high voltage generating circuit 300 is to provide a high voltage equal to or greater than a given level to the row decoder 900 and the program latch circuit 1000. A sequential output circuit 240 is controlled by the output of the erasing sensor 220 to sequentially provide high voltage level control signals to the high voltage generating circuit 300. An address counter 500 is controlled by the erasing sense signal of the erasing sensor 220 so as to provide address counting clock pulses to the address buffer 800.

The erasing sensor 220 may be generally indicated by reference number 200 including the sense amplifying circuit 210, since though the sense amplifying circuit 210 is usually contained in the existing system, it is associated with the erasing sensor 220 so as to serve as a circuit for testing the erasing state of the memory cells. However, in this description, the sense amplifying circuit 210 and the erasing sensor 220 are separately expressed for convenience.

Figure 2A:
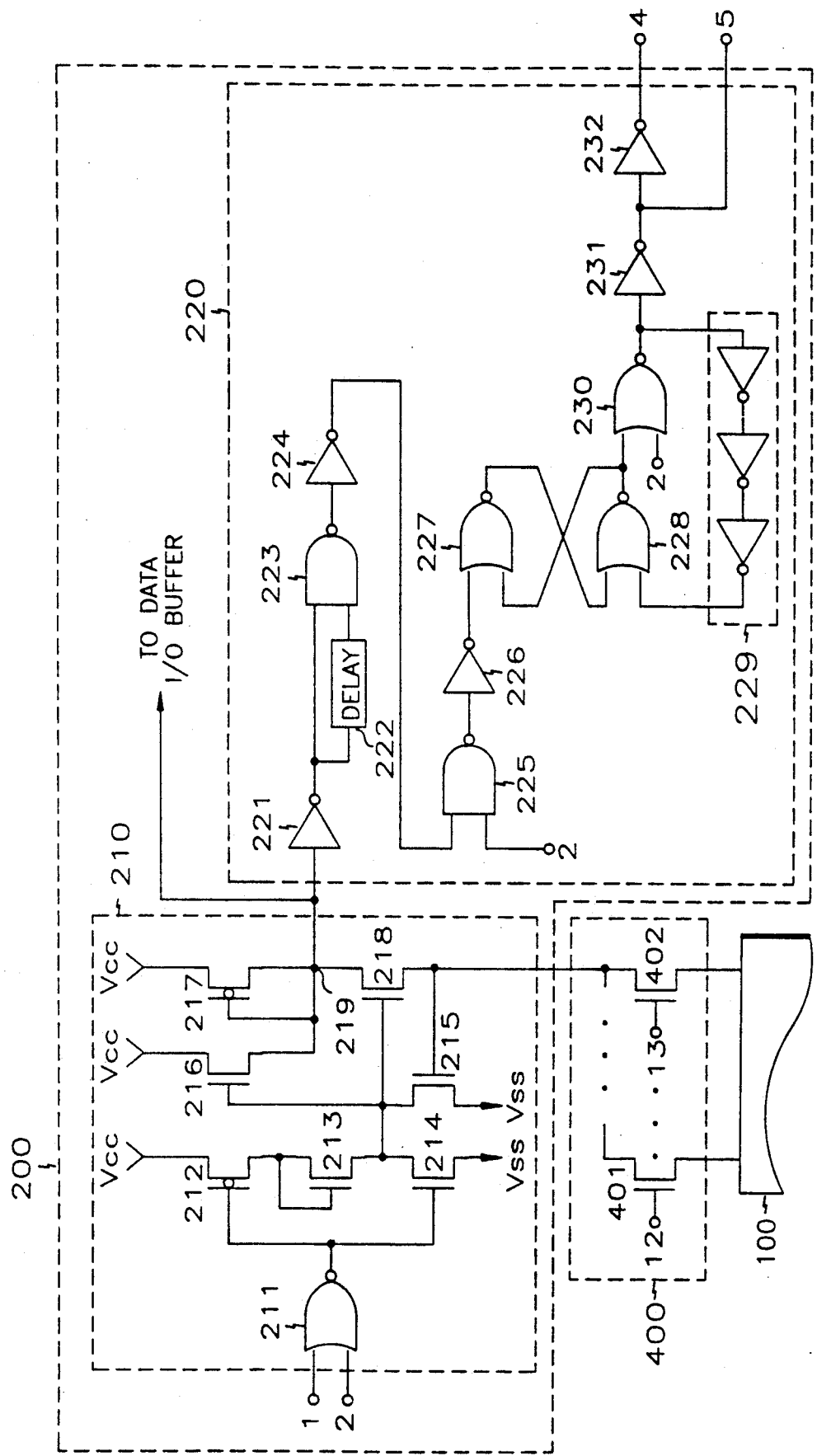
FIG. 2A is a circuit diagram for illustrating the relationship between memory cell array (100), column decoder (400), sense amplifying circuit (210) and erasing sensor (220) of FIG. 1.

Referring to FIG. 2A for illustrating the relationship between the memory cell array 100, column decoder 400, sense amplifying circuit 210 and erasing sensor 220, the column decoder 400 includes a plurality of column selection transistors 401, 402 of which the channels are respectively connected to the bit lines of the memory cell, and the gates are respectively coupled to the output terminals 12, 13 of the address buffer 800. The sources of the column selection transistors 401, 402 are commonly connected. It will be appreciated that the outputs 12, 13 of the address buffer 800 sequentially turn on the column selection transistors to select the columns.

The sense amplifying circuit 210 includes a NOR gate 211 receiving write enable signal 1 and erasing signal 2, a plurality of PMOS transistors 212, 217 and NMOS transistors 213–216, 218. The sense amplifying circuit 210 is controlled by the write enable signal 1 and the erasing signal 2 so as to sense and amplify the voltages of the bit lines of the memory cell array outputted through an output node 219 between the PMOS transistor 217 and the NMOS transistor 218 connected in series between the source voltage terminal and the common source line of the column selection transistors 401, 402. The output node 219 is connected to the data input/output buffer 600 and erasing sensor 220.

The erasing sensor 220 includes inverters 221, 224 and delay circuit 222 for adjusting the pulse width of and delaying the output of the sense amplifying circuit 21C, a NAND gate 225 and inverter 226 for gating the output of the inverter 224 in response to the erasing signal 2, cross-coupled NOR gates 227, 228 for latching the gated signal, a NOR gate 230 for feeding the output of the NOR gate 228 through inverters 229 back to the input terminal of the NOR gate 228 or to the next stage, and inverters 231, 232 for inverting and recovering the output of the NOR gate 230 so as to generate non-reversed and reversed erasing sense signals 4 and 5.

Figure 2B:
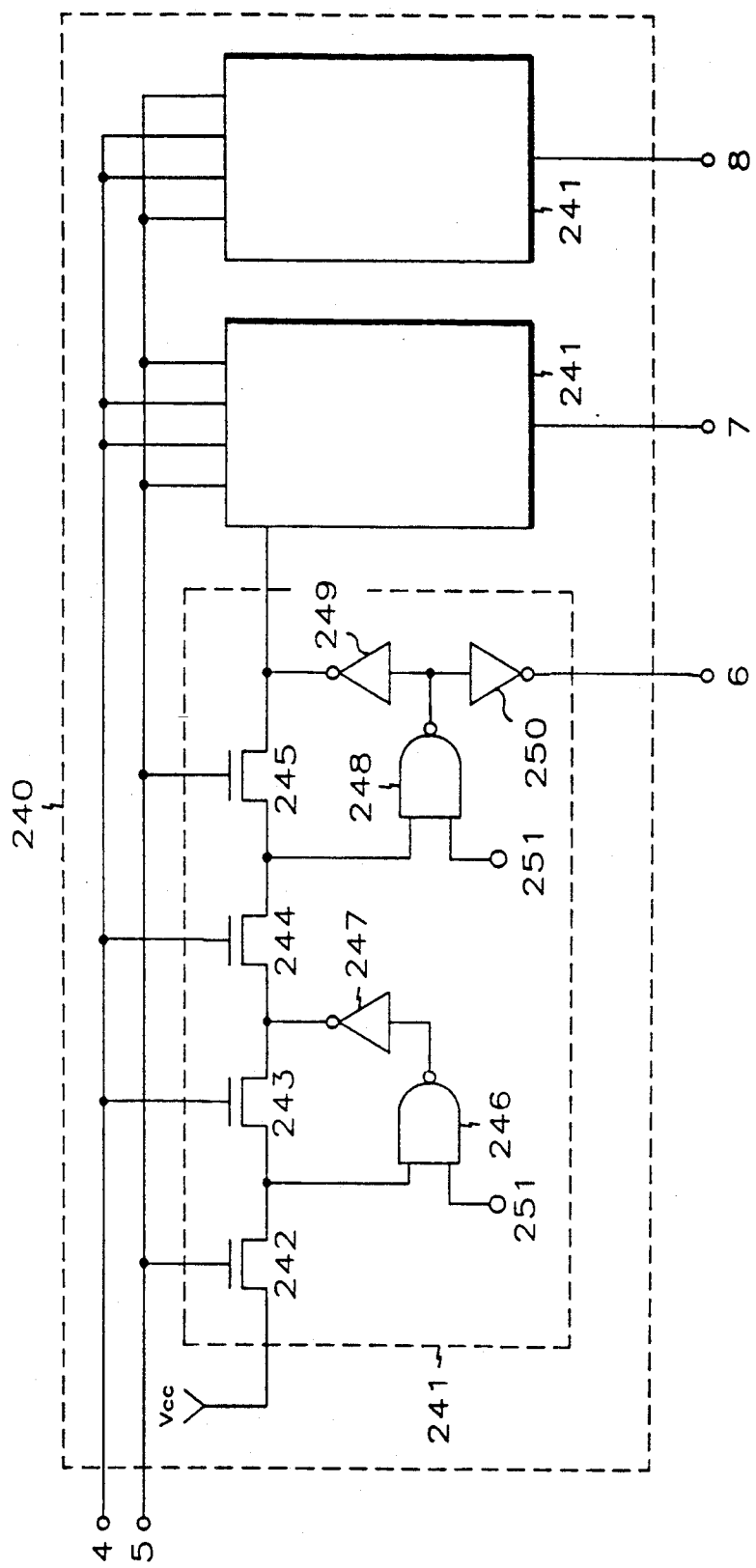
FIG. 2B is a circuit diagram for illustrating sequential output circuit (240) of FIG. 1.

Referring to FIG. 2B, the sequential output circuit 240 includes three shift registers 241 connected in series and commonly receiving the non-reversed and reversed erasing sense signals 4 and 5. Each of the shift registers 241 is a conventional one including NMOS transistors 242–245, NAND gates 246, 248 with an input receiving reset signal 251, and inverters 247, 249, 250.

Thus, the sequential output circuit 240 receives the erasing sense signals 4, 5 as the clock pulses so as to sequentially generate a first, second and third high voltage level control signals 6, 7 and 8 to the high voltage generating circuit 300.

Figure 3:
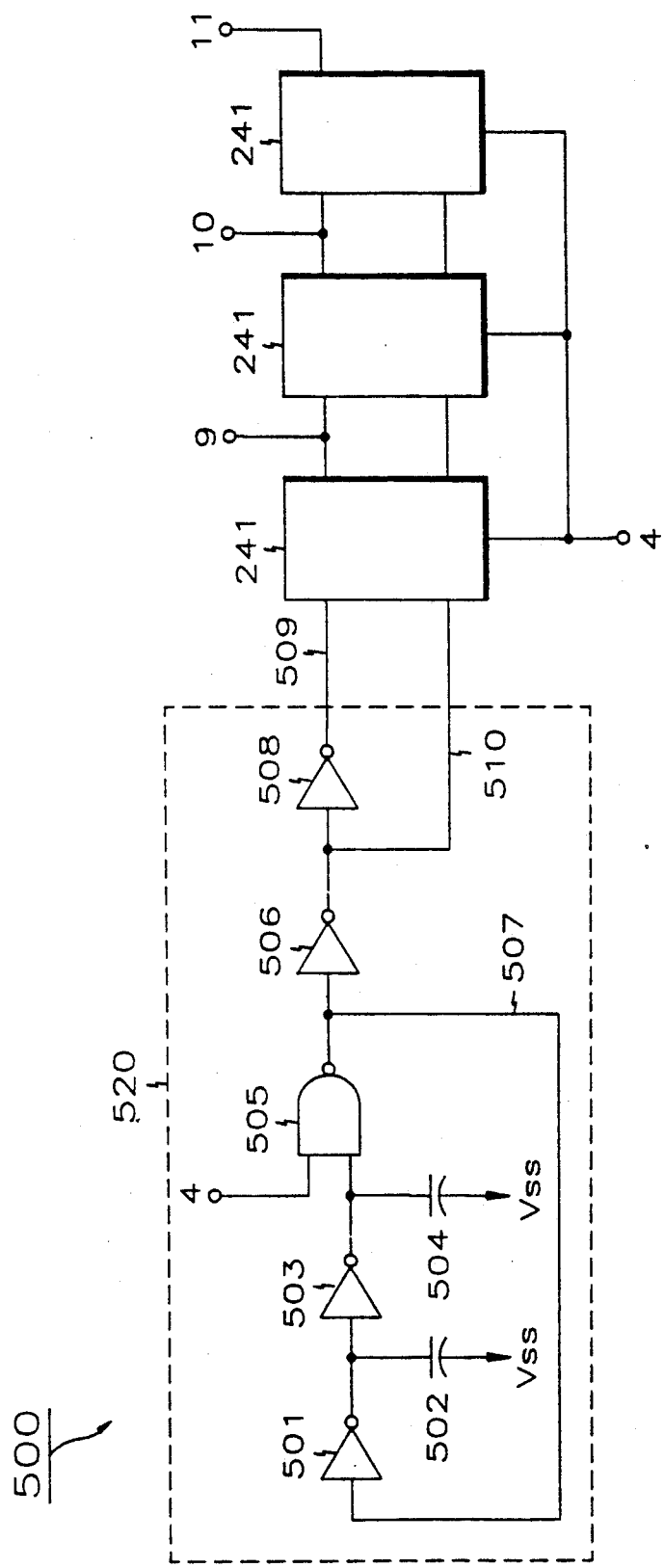
FIG. 3 is a circuit diagram for illustrating address counter (500) of FIG. 1.

Referring to FIG. 3, the address counter 500 includes a counting clock generating circuit 520 for generating clock pulses under the control of the erasing sense signal 4, and three series-connected shift registers 241 which receives the non-reversed and reversed outputs 509 and 510 of the counting clock generating circuit 520.

The counting clock generating circuit 520 is composed of a parallel-connected double stage delay circuit including inverters 501, 503 and capacitors 502, 504, a NAND gate 505 for gating the output of the delay circuit in response to the non-reversed erasing sense signal 4, a line 507 for feeding the output of the NAND gate 505 back to the delay circuit, and inverters 506, 508 for generating the non-reversed and reversed outputs 509, 510. The shift registers 241 have the same construction as that of FIG. 2B, and controlled by the non-reversed erasing sense signal 4. The outputs 9, 10, 11 of the shift registers 241 are applied to the address buffer 800 of FIG. 1.

Figure 4:
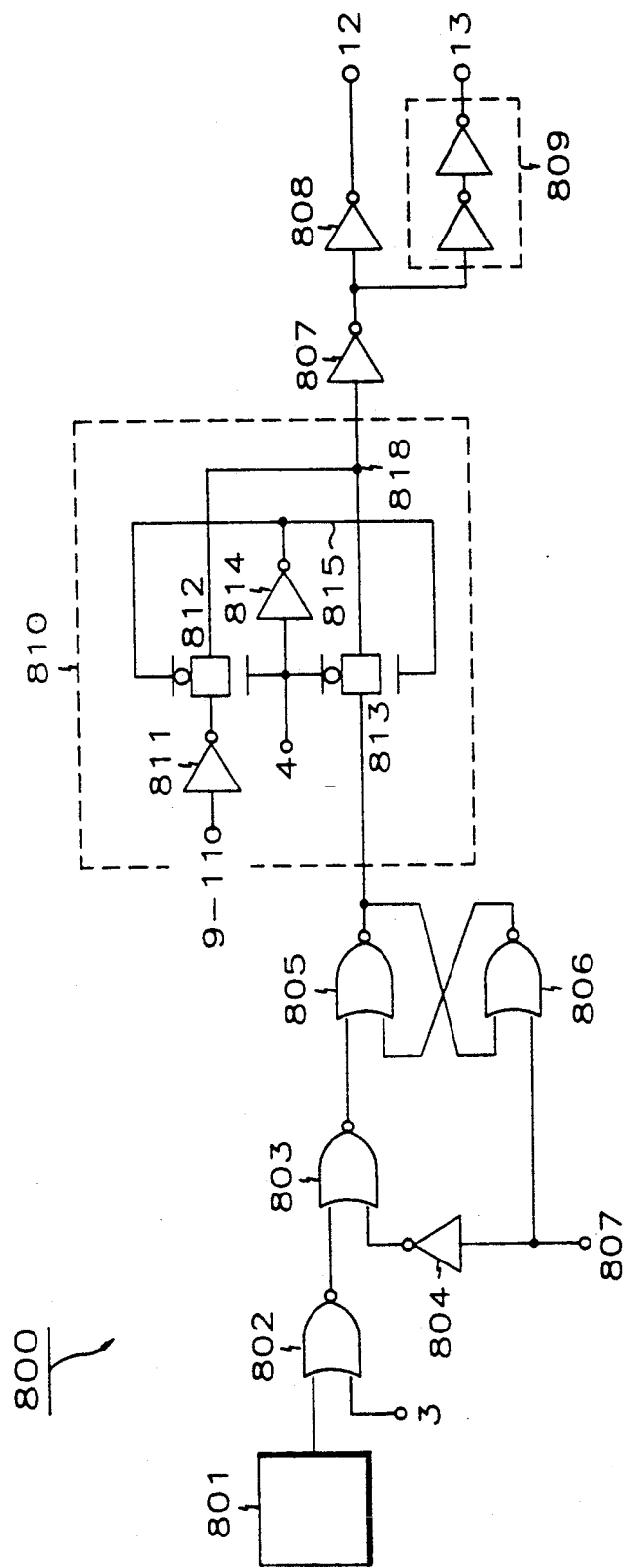
FIG. 4 is a circuit diagram for illustrating address buffer (800) of FIG. 1.

Referring to FIG. 4, the address buffer 800 is shown as having a single input pad 801, but in practice there are provided a plurality of input pads connected to the same circuits as shown. The address buffer includes a NOR gate 802 for receiving the external address signal through the input pad 801 and chip enable signal terminal 3, NOR gates 803, 805, 806 and inverter 804 for latching and outputting the gated external address according to a given control signal 807, an output terminal including inverters 807–809 for transmitting address select signals 12, 13 to the gates of the column selection transistors 401, 402 of FIG. 2A, and a gate circuit 810 interposed between the output terminal and the latch circuit including the NOR gates 805, 806.

The gate circuit 810 includes a first gate circuit 811, 812 for gating the outputs 9-11 of the address counter 500 applied to the output terminal, a second gate circuit 813 for gating the output of the latch circuits 805, 806 applied to the output terminal, and a control circuit 814, 815 for controlling the first and second gate circuits 811, 812, and 813 in response to the non-reversed erasing sense signal 4.

It will be appreciated that the chip enable signal 3, control signal 807, write enable signal 1, erasing signal 2 and reset signal 251, etc. are conventionally generated from the control signal generating circuit 1100 of FIG. 1.

Figure 5:
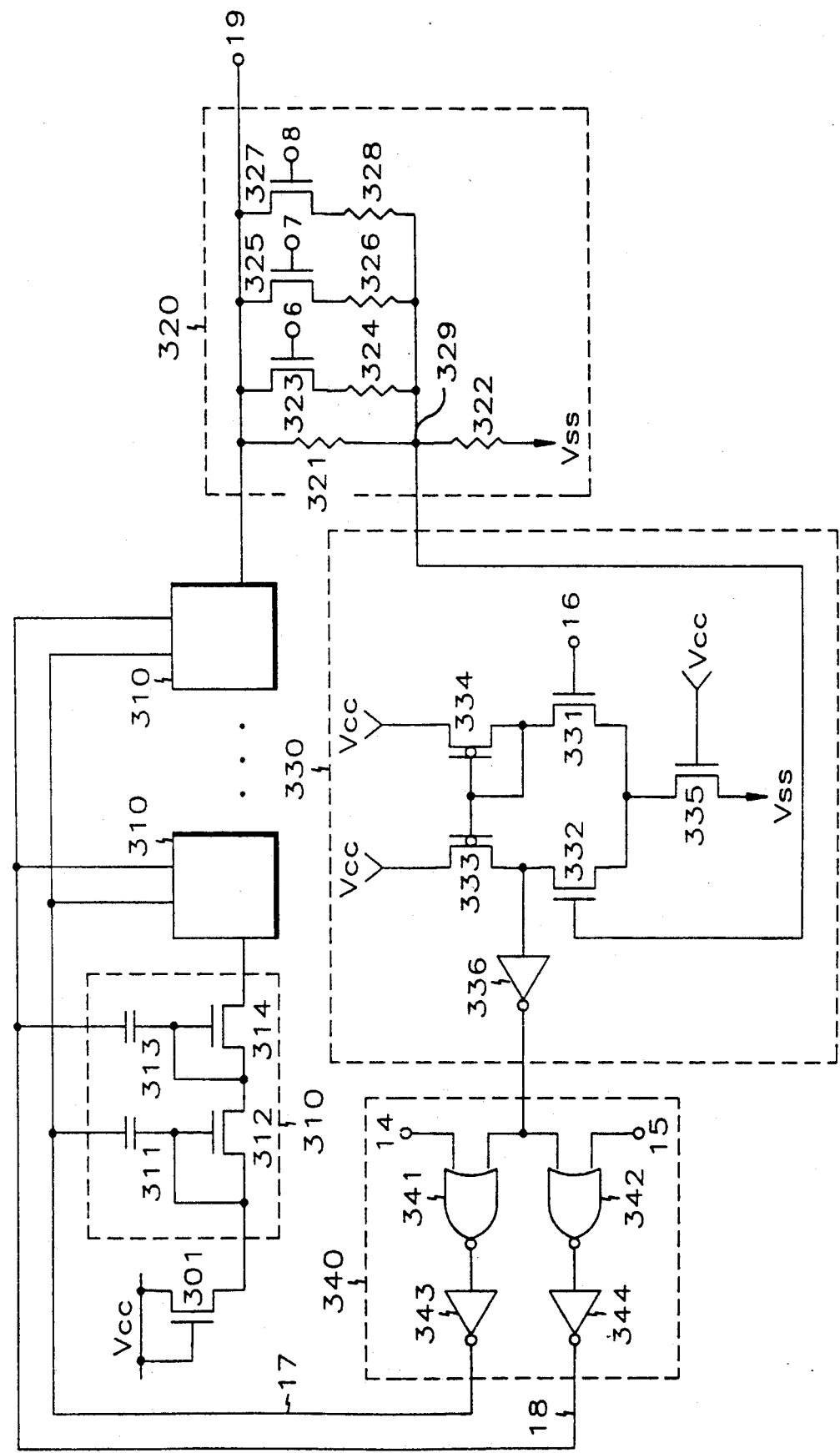
FIG. 5 is a circuit diagram for illustrating high voltage generating circuit (300) of FIG. 1.

Referring to FIG. 5, the high voltage generating circuit 300 includes a plurality of voltage pump circuits 310 for raising the input voltage in response to pump control signals 17, 18, a high voltage sensor 320 connected to an output terminal 19 for sensing the level of the high voltage finally outputted, a comparing and amplifying circuit 330 for comparing the output of the high voltage sensor 320 with a reference voltage 16, and a pump gate gate circuit 340 for receiving the output of the comparing and amplifying circuit 330 and pump clock pulses 14, 15 to provide pump control signals 17, 18 to the voltage pump circuits 310.

The voltage pump circuit 310 includes capacitors 311, 313 with one electrode connected to the pump control signals 17, 18, and NMOS transistors 312, 314 with the gate and drain connected to the other electrode of the capacitors 311, 313, which is a conventional structure. The first stage of the voltage pump circuits 310 is connected with a pull-up NMOS transistor 301 with the gate and drain connected to the source voltage terminal.

The high voltage sensor 320 includes a first and second resistors 321 and 322 connected in series between the high voltage output terminal 19 and the ground voltage terminal, and three dynamic resistors 324, 326 and 328 connected in parallel to the first resistor 321. Each of the dynamic resistors includes an N-type insulating-gate transistor 323, 325, 327 connected in series to the resistors 324, 326, 328. The gates of the insulating-gate transistors 323, 325, 327 are respectively connected to the first, second and third high voltage level control signals 6, 7 and 8 outputted from the sequential output circuit 240 of FIG. 2B.

The comparing and amplifying circuit 330 is a conventional N-channel input type including two PMOS transistors 333, 334, three NMOS transistors 331, 332, 335, and an inverter 336 for inverting the output.

The pump gate circuit 340 includes two NOR gates 341, 342 with one input commonly connected to the output of the comparing and amplifying circuit 330 and the other inputs respectively connected to pump clock pulses 14, 15 of the logic combinations generated from an oscillator, etc., and two inverters 343, 344 for respectively receiving the outputs of the NOR gates 341, 342 to provide the pump control signals 17, 18 to the voltage pump circuits 310. Thus, the high voltage generating circuit 300 provides a high voltage for erasing the memory cells to the row decoder 900 of FIG. 1, wherein the level of the high voltage is properly controlled according to the sensing level of the high voltage sensor 320 responding to the first, second and third high voltage level control signals.

Figure 6:
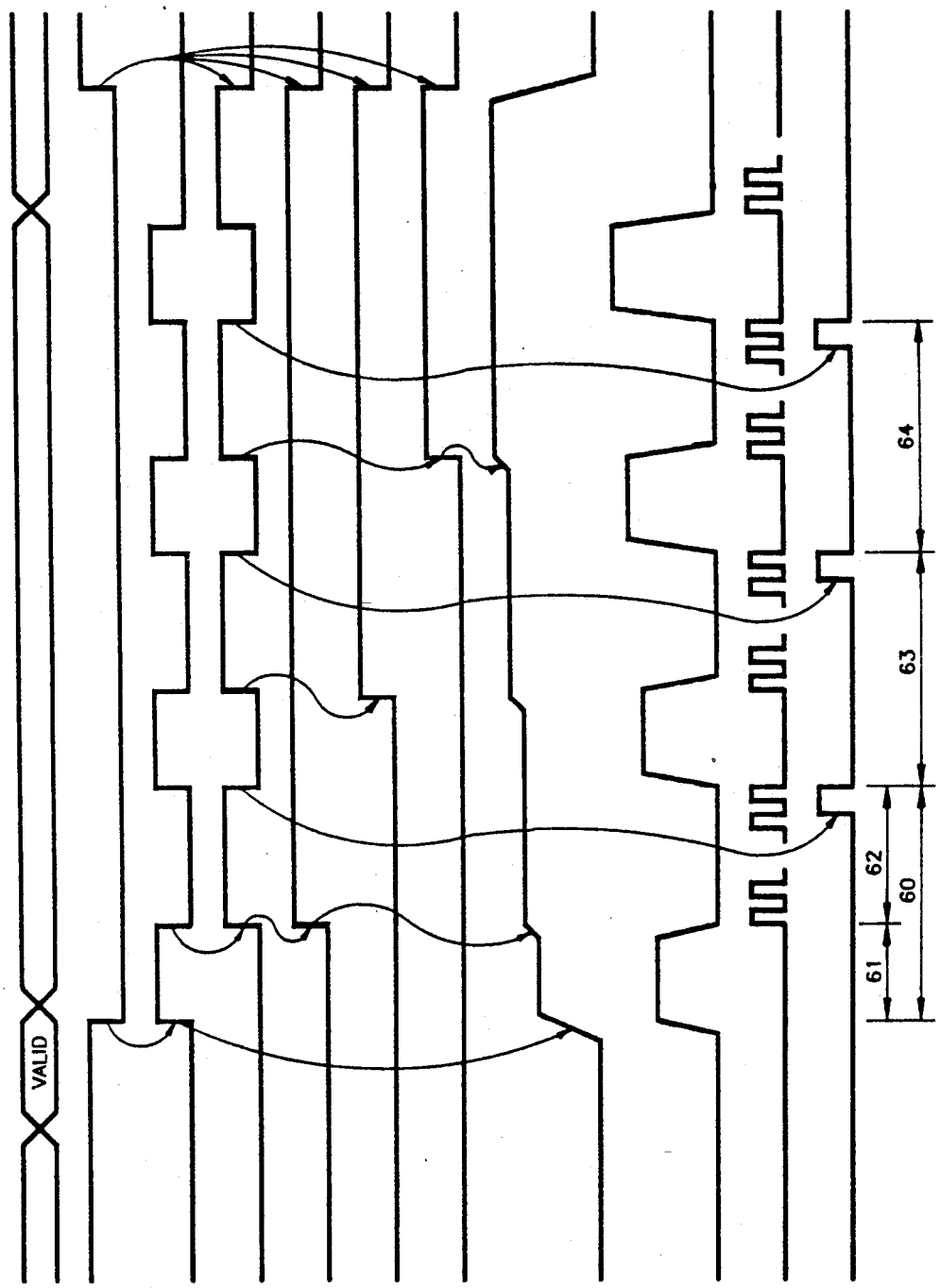
FIG. 6 is a timing diagram for illustrating optimization procedure of automatic erasing according to the present invention.

Referring to FIG. 6, the reference character A represents the address signal, B the write enable signal 1, C the erasing signal 2, D the non-reversed erasing sense signal 4, E the first high voltage level control signal 6, F the second high voltage level control signal 7, G the third high voltage level control signal 8, H the level of the high voltage of the high voltage output terminal 19, I the voltage of the word line of a memory cell, J the address counting clock pulses, and K the data informing of bad erasing state of the memory cell. Also, there are shown repeated erasing cycles 60, 63, 64 each one of which includes real erasing interval 61 and erasing test interval 62.

Hereinafter, the operation of the inventive circuit will be described with reference to FIGS. 1 to 6.

First, in the real erasing interval 61, if the write enable signal 1 is at the logic "low", the erasing signal 2 is driven to disable the NAND gate 225 and NOR gate 227 of the erasing sensor 220, so that the non-reversed and reversed erasing sense signals 4 and 5 respectively become logic "low" and "high". Then, the MOS transistors 243, 244 of the shift register 241 in the sequential output circuit 240 are turned off, so that all the first, second and third high voltage level control signals 6, 7 and 8 become logic "low". Consequently, the NAND gate 505 of the counting clock generating circuit 520 in the address counter 500 and the first gate circuit 812 of the address buffer are disabled, so that the address counter 800 normally receives the external address to provide the internal address to the row decoder 900 and column decoder 400. Meanwhile, since the N-type insulating-gate transistors 323, 325, 327 for driving the dynamic resistors are turned off, the high voltage generating circuit 300 applies the voltage of the high voltage output terminal 19 as divided by the first and second resistors 321 and 322 (hereinafter respectively referred to as "R1 and R2"), namely, Vpp×R2/(R1+R2), to the gate of the NMOS transistor 332 of the comparing and amplifying circuit 330, which compares the output of the high voltage sensor 320 with the reference voltage 16 inputted into the gate of the NMOS transistor 331. If the output is lower than the reference voltage 16, the circuit 330 outputs a signal of logic "low" state through the inverter 336.

Then, the NOR gates 341, 342 of the pump gate circuit 340 respectively output the pump control signals 16, 17 of opposite logics responding to the pump clock pulses 14, 15. Thus, the voltage pump circuit 310 works in response to the pump control signals 16, 17 to increase the voltage of the high voltage output terminal 19 from the source voltage level 5 V to about 17 V or alternately from 15 volts to 205 volts that is applied through the row decoder 900 to the word lines of the memory cell array, as shown in FIG. 1, so as to perform flash-type erasing.

That the voltage of the high voltage output terminal 19 is initially 5 V is due to the fact that the minimum level is not clamped at the source voltage level. In the voltage pumping of the voltage pump circuit 310, if the pump control signals 17 and 18 respectively of logic "high" and "low" states are respectively applied to the capacitors 311, 313, the voltages loaded on the gates and drains of the NMOS transistors 312, 314 that initially have the value of Vcc (source voltage)—Vth (threshold voltage of NMOS transistor) by the pull-up NMOS transistor 301 are continuously increased with proceeding towards next stages by the charged values of the capacitors 311, 313.

It will be readily appreciated by one having the ordinary knowledge in the are that the above procedure is the same as the erasing of a conventional EEPROM.

After the real erasing interval 61, there is automatically carried out the erasing test interval 62 as shown in FIG. 6. Namely, if the erasing signal 2 is disabled into logic "low" state after the real erasing interval 61, the erasing sensor 220, sequential output circuit 240 and address counter 500 are driven, and in the address buffer 800, the second gate circuit 813 for normally gating the external address is disabled while the first gate circuit 812 for receiving the outputs 9-11 of the address counter 500 is driven.

Hence, the address counting clock pulses J that are the outputs 9-11 of the address counter 500 pass through the first gate circuit 812 becoming irrelatively to the external address the outputs 12, 13 of the address buffer 800 that are sequentially applied to the gates of the column selection transistors 401, 402 to test the erasing state of each of the memory cells of the memory cell array 100. At this time, if any one memory cell in each page is not sufficiently erased, there is sensed the data K of logic "high" state at one end of the channels of the column selection transistors 401, 402 connected to the bit lines of the memory cell array 100, which data turn off the NMOS transistor 218 of the sense amplifying circuit 210, since the common data line of the column selection transistors 401, 402 gets a high voltage to make the NMOS transistor 215 conductive so as to drop the gate voltage of the NMOS transistor 218. Thus, the output 219 of the sense amplifying circuit 210 becomes logic "high". As a result, since the non-reversed and reversed erasing sense signals 4 and 5 outputted from the erasing sensor 220 respectively get logic "high" and "low" states, the first shift register 241 of the sequential output circuit 240 generates the first high voltage level control signal 6 of logic "high" state. Then, the N-type insulating-gate transistor 323 of the high voltage generating circuit 300 is turned on to drive the resistor 324 (R3), so that the output 329 of the high voltage sensor 320 has the value of $Vpp \times R2/R1+R2+R3$) which is lower than the voltage by the first and second resistors 321 and 322. Hence, the output of inverter 336 of the comparing and amplifying circuit 330 is maintained in the logic "low", thus causing the pump clock pulses 14, 15 to be applied to the voltage pump circuit 310, so that the voltage of the high voltage output terminal 19 becomes higher (about 18 V) than the level (about 17 V) as in the real erasing interval 61. This erasing voltage of high level is again applied to the word line of the imperfectly erased cell, thus completely erasing the cell. This is performed in the real erasing interval of the next erasing cycle 63, when the erasing signal 2 is again enabled into logic "high" state and the erasing sense signals 4, 5 are disabled.

As shown in FIG. 6, if there is checked out during the erasing test interval 62 the memory cell required to be again erased, the next erasing cycle 63 is carried out. And whenever the erasing cycle is repeated, the level of the applied erasing voltage is increasing by 1 V.

As stated above, the cycles of real erasing interval→erasing test interval→real erasing interval are automatically repeated until all the memory cells are completely erased. Finally, if the testing by the address counting pulses J does not show the data K of logic "high" state at the output 219 of the sense amplifying circuit 210, the erasing cycles are stopped.

At this time, the voltage of the high voltage output terminal 19 takes a considerably high level, so that the output of the high voltage sensor 320 takes a higher level than the reference voltage 16.

Hence, the output of the inverter 336 of the comparing and amplifying circuit 330 becomes logic "high" so as to disable the NOR gates 341, 342 to block the pump clock pulses 14, 15, and therefore the voltage pump circuit 310 no longer performs the pumping operation. Of course, if the voltage of the high voltage output terminal 19 is lowered below a given value, the voltage pumping operation is again performed according to the output state of the comparing and amplifying circuit 330.

As stated above, the present invention provides a circuit for automatically erasing the memory cells of a flash-type EEPROM as well as testing their erasing state so as to automatically repeat the erasing operation for the memory cells found to be imperfectly erased, thus ensuring properly erased state of the memory cells. Hence, there is prevented misoperation of a flash-type EEPROM in the erasing and programming modes. Moreover, the inventive EEPROM controls the erasing voltage to be maintained as having a proper level, thus realizing stabilized erasing operation.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. An automatic erasing optimization circuit for use in an electrically erasable and programmable semiconductor memory having a memory cell array containing a plurality of word lines, a plurality of bit lines and a plurality of memory cells connected to said word and bit lines, a row decoder connected to said bit lines, a column decoder connected to said word lines, an address buffer for supplying said row and column decoders with external address signals, a data input/output buffer, and a program latch means for supplying the bit lines of said memory cell array with a program voltage of high level, comprising:

erasing sense means connected between said column decoder and said data input/output buffer for sensing the output state of said column decoder in response to a write enable signal and erasing signal to generate sense signals of opposite logic states;

sequential output means having a first, second and third registers connected in series and receiving the output signals of said erasing sense means to respectively generate a first, second and third high voltage level control signals;

high voltage generating means for generating a high voltage equal to or greater than a given level to both said row decoder and said program latch means in response to pump clock pulses and said first, second and third high voltage level control signals; and address counting means for supplying said address buffer with address counting clock pulses in response to the output signal of said erasing sense means.

2. An automatic erasing optimization circuit as claimed in claim 1, wherein said erasing sense means comprises:

sense amplifying means for sensing voltage of a corresponding bit line through said column decoder in response to said write enable signal and erasing signal, the voltage of said corresponding bit line being applied to said data input/output buffer; and logic means for receiving the output to generate said erasing sense signals in response to said erasing signal.

3. An automatic erasing optimization circuit as claimed in claim 1, wherein said high voltage generating circuit comprises:

a high voltage output terminal;

dynamic resistor means connected to said high voltage output terminal for responding to said first, second and third high voltage level control signals;

comparing amplifying means for receiving a reference voltage and the output of said dynamic resistor means;

pump gating means for receiving the output of said comparing amplifying means to generate pump control signals in response to said pump clock pulses; and voltage pump circuit means for generating a high voltage to said high voltage output terminal in response to said pump control signals.

4. An automatic erasing optimization circuit as claimed in claim 1, wherein said high voltage has an amplitude of approximately 15 V to 20 V.

5. An automatic erasing optimization circuit as claimed in claim 3, wherein said dynamic resistor means comprises:

a first and second resistors connected in series between said high voltage output terminal and a ground voltage terminal;

an output terminal interposed between said first and second resistors; and a first, second and third dynamic resistors sequentially connected in parallel between said high voltage output terminal and said output terminal to respectively respond to said first, second and third high voltage level control signals.

6. An automatic erasing optimization circuit as claimed in claim 5 wherein said first, second and third dynamic resistors each comprise:

insulating-gate transistors with drains connected to said high voltage output terminal and gates respectively positioned to receive said first, second and third high voltage level control signals, and resistors respectively connected between sources of said insulating-gate transistors and said output terminal.

7. An automatic erasing optimization claim 1, wherein said address buffer comprises:

first gating means for receiving said address counting clock pulses;

second gating means for receiving an external address signal;

means for controlling switching of said first gating means and second gating means in response to said erasing sense signal; and a plurality of output terminals coupled to said first gating means and said second gating means to provide said external address signals.

8. An automatic erasing optimization circuit as claimed in claim 1, wherein said column decoder comprises a plurality of column selection transistors having channels connected between the bit lines of said memory cell array and said sense amplifying means and the gates connected to output terminals of said address buffer.

9. An automatic erasing optimization circuit for use in an electrically erasable and programmable semiconductor memory having a memory cell array containing a plurality of word lines, a plurality of bit lines and a plurality of memory cells connected to said word and bit lines, a row decoder connected to said bit lines, a column decoder connected to said word lines, an address buffer for supplying said row and column decoders with external address signals, a data input/output buffer, and a sense amplifying circuit for sensing and amplifying the output voltage of said column decoder in response to said write enable signal and erasing signal to generate an output to said data input/output buffer, comprising:

erasing sensing means for generating an erasing sense signal by sensing the output of said sense amplifying circuit and said erasing signal;

sequential output means comprising first, second and third shift registers connected in series and respectively generate a first, second and third voltage level control signals in response to said erasing sense signal;

high voltage generating means for generating a high voltage equal to or greater than a given level to said row decoder in response to pump clock pulses and said first, second and third high voltage level control signals; and address counting means for supplying said address buffer with address counting clock pulses in response to said erasing sense signal.

10. An automatic erasing optimization circuit as claimed in claim 9, wherein said erasing sensing means comprises:

means for delaying and recovering the output of said sense amplifying circuit;

means for gating the delayed and recovered signal in response to erasing signal; and means for latching the gated signal in response to said erasing signal.

11. An automatic erasing optimization circuit as claimed in claim 9, wherein said high voltage generating means comprises:

a high voltage output terminal;

dynamic resistance means connected to said high voltage output terminal, for responding to said first, second and third high voltage level control signals;

comparing amplifying means for receiving a reference voltage and the output of said dynamic resistance means;

pump gating means for receiving the output of said comparing amplifier to generate pump control signals in response to said pump clock pulses; and voltage pump means for generating a high voltage of a given level to said high voltage output terminal in response to said pump control signals.

12. An automatic erasing optimization circuit as claimed in claim 9, wherein said high voltage has the level of approximately 15 V to 20 V.

13. An automatic erasing optimization circuit as claimed in claim 11, wherein said dynamic resistance means comprises:

first and second resistors connected in series between said high voltage output terminal and a reference voltage terminal;

an output terminal interposed between said first and second resistors;

first, second and third dynamic resistors sequentially connected in parallel between said high voltage output terminal and said output terminal to respectively respond to said first, second and third high voltage level control signals;

said first, second and third dynamic resistance means comprising:

insulating-gate transistors having drains connected to said high voltage output terminal and gates respectively connected to receive said first, second and third high voltage level control signals, and a plurality of resistors respectively connected between sources of said insulating-gate transistors and said output terminal.

14. An automatic erasing optimization circuit of claim 9, wherein said address buffer comprises:

first gating means for receiving said address counting clock pulses;

second gating means for receiving an external address signal; and means for controlling switching of said first gating means and second gating means in response to said erasing sense signal; and a plurality of output terminals coupled to said first gating means and said second gating means to provide said external address signals.

15. An automatic erasing optimization circuit as claimed in claim 9, wherein said column decoder comprises a plurality of column selection transistors having channels connected between the bit lines of said memory cell array and said sense amplifying means and the gates connected to output terminals of said address buffer.

16. An automatic erasing optimization method in an automatic erasing optimization circuit for an electrically erasable and programmable semiconductor memory including a memory cell array containing a plurality of word lines, a plurality of bit lines and a plurality of memory cells connected to said word and bit lines, a row decoder connected to said bit lines, a column decoder connected to said word lines, an address buffer for supplying said row and column decoders with external address signals, a data input/output buffer, and a sense amplifying circuit for sensing and amplifying the output voltage of said column decoder in response to said write enable signal and erasing signal to generate an output to said data input/output buffer, said automatic erasing optimization circuit comprising erasing sense means for sensing the output of said sense amplifying circuit and said erasing signal to generate an erasing sense signal, sequential output means for receiving said erasing sense signal to sequentially generate a first, second and third high voltage level control signals, a high voltage generating circuit generating a high voltage equal to or greater than a given level to said row decoder in response to said first, second and third high voltage level control signals, and an address counter supplying said address buffer with address counting clock pulses in response to said erasing sense signal, said address buffer comprising first gate means for receiving said address counting clock pulses, second gate means for receiving an external address signal, and means for controlling switching of said first and second gate means in response to said erasing sense signal, said method comprising the steps of:

erasing the data stored in a selected memory cell;

sensing erasing states of the memory cells by applying the output of said address buffer responding to said address counting clock pulses to said column decoder during said erasing signal and erasing sense signal being respectively disabled and enabled; and sequentially providing said first, second and third high voltage level control signals to said high voltage generating circuit according to said erasing sense signal received, said steps being successively repeated.

17. An automatic erasing optimization method as claimed in claim 16, wherein said erasing sense means is operated to generate an effective erasing sense signal only during said erasing signal being disabled, said erasing sense means comprising:

means for delaying and recovering the output of said sense amplifying circuit;

means for gating the delayed and recovered signal in response to said erasing signal; and means for latching the gated signal in response to said erasing signal.

18. An automatic erasing optimization method as claimed in claim 16, further comprising said sequential output means being synchronized by said erasing sense signal, said sequential output means comprising first, second and third shift registers connected in series and respectively generating said first, second and third high voltage level control signals.

19. An automatic erasing optimization method as claimed in claim 16, further comprising:

first, second and third resistance means sequentially connected in parallel between said high voltage output terminal and said output terminal respectively respond to said first, second and third high voltage level control signals, said high voltage generating circuit comprising:

a high voltage output terminal, dynamic means connected to said high voltage output terminal for responding to said first, second and third high voltage level control signals, comparing amplifier means for receiving a reference voltage and the output of said dynamic means, pump gate means for receiving the output of said comparing amplifier to generate pump control signals in response to said pump clock pulses, and a voltage pump means for generating a high voltage of a given level to said high voltage output terminal in response to said pump control signals, said dynamic means comprising:

first and second resistors connected in series between said high voltage output terminal and a reference voltage terminal, and an output terminal interposed between said first and second resistors.

20. An automatic erasing optimization method as claimed in claim 19, wherein said first, second and third resistance means comprise:

insulating-gate with chains connected to said high voltage output terminal and gates respectively connected to receive said first, second and third high voltage level control signals, and resistors respectively connected between a source of corresponding different ones of said insulating-gate transistors and said output terminal.

21. An automatic erasing optimization method of claim 16, further comprising the first and second gate means of said address buffer being controlled by said erasing sense signal to output said address counting clock pulses through said first gate means to said column decoder only during said erasing sense signal being enabled.

22. An automatic erasing optimization method of claim 16, wherein said column decoder comprises a plurality of column selection transistors with channels connected between the bit lines of said memory cell array and said sense amplifying circuit and the gates connected to the output of said address buffer.

23. An automatic erasing optimization method as claimed in claim 16, wherein said high voltage has the level of approximately 15 V to 20 V.

24. An electrically erasable and programmable semiconductor memory comprising:

a memory cell array containing a plurality of word lines, a plurality of bit lines and a plurality of memory cells connected to said word and bit lines;

a row decoder connected to the bit lines of said memory;

an address buffer for receiving external address signals;

a column decoder comprising a plurality of column selection transistors with channels connected to the word lines of said memory cell array and gates connected to the output of said address buffer;

a data input/output buffer;

sense amplifying means for sensing and amplifying output voltage of said column decoder through channels of said column selection transistors in response to said write enable signal and erasing signal to generate an output to said data input/output buffer;

erasing sense means comprising:

means for delaying and recovering the output of said sense amplifying means, and means for gating the delayed and recovered signal in response to erasing signal, and means for latching the gated signal in response to said erasing signal, sequential output means comprising first, second and third shift registers connected in series to respectively generate first, second and third high voltage level control signals in response to said erasing sense signal;

high voltage generating means for generating a high voltage equal to or greater than a given level to said row decoder in response to pump clock pulses and said first, second and third high voltage level control signals; and address counting means for providing address counting clock pulses to said address buffer in response to said erasing sense signal, said address buffer comprising:
first gating means for receiving said address counting clock pulses,
second gating means for receiving an external address signal, and
means for controlling the switching of said first and second gate means in response to said erasing sense signal.

25. An electrically erasable and programmable semiconductor memory of claim 24, further comprising a program latch circuit connected to the bit lines of said memory cell array to provide a programming voltage of high amplitude.

26. An electrically erasable and programmable semiconductor memory as claimed in claim 24, wherein said high voltage generating circuit comprises:
a high voltage output terminal;
dynamic resistance means connected to said high voltage output terminal for responding to said first, second and third high voltage level control signals;
comparing means for receiving a reference voltage and the output of said dynamic resistor means;
pump gating means for receiving the output of said comparing means to generate pump control signals in response to said pump clock pulses; and
voltage pumping means for generating a high voltage of a given amplitude of said high voltage output terminal in response to said pump control signals.

27. An electrically erasable and programmable semiconductor memory as claimed in claim 26, wherein said dynamic means comprises:
first and second resistors connected in series between said high voltage output terminal and ground voltage terminal;
an output terminal interposed between said first and second resistors; and first, second and third resistance means sequentially connected in parallel between said high voltage output terminal and said output terminal to respectively respond to said first, second and third high voltage level control signals;

said first, second and third resistance means comprising insulating-gate transistors with drains connected to said high voltage output terminal and gates respectively connected to receive said first, second and third high voltage level control signals, and third, fourth and fifth resistors respectively connected between sources of different corresponding ones of said insulating-gate transistors and said output terminal.

28. An electrically erasable and programmable semiconductor memory of claim 24, wherein said high voltage has an amplitude of approximately of 15 V to 20 V.

29. An automatic erasing optimization circuit as claimed in claim 3, wherein said high voltage has the level of 15 V to 20 V.

30. An automatic erasing optimization circuit as claimed in claim 2, wherein said column decoder comprises a plurality of column selection transistors with the channels connected between the bit lines of said memory cell array and said sense amplifying circuit and the gates connected to the outputs of said address buffer.

31. An automatic erasing optimization circuit as claimed in claim 7, wherein said column decoder comprises a plurality of column selection transistors with the channels connected between the bit lines of said memory cell array and said sense amplifying circuit and the gates connected to the outputs of said address buffer.

32. An automatic erasing optimization circuit as claimed in claim 11, wherein said high voltage has the level of 15 V to 20 V.

33. An automatic erasing optimization circuit as claimed in claim 14, wherein said column decoder comprises a plurality of column selection transistors with the channels connected between the bit lines of said memory cell array and said sense amplifying circuit and the gates connected to the output of said address buffer.

34. An automatic erasing optimization circuit as claimed in claim 21, wherein said column decoder comprises a plurality of column selection transistors with the channels connected between the bit lines of said memory cell array and said sense amplifying circuit and the gates connected to the output of said address buffer.

35. An electrically erasable and programmable semiconductor memory as claimed in claim 26, wherein said high voltage has the level of 15 V to 20 V.

* * * * *

UNITED STATES PATENT AND TRADEMARK OFFICE
CERTIFICATE OF CORRECTION

PATENT NO. : 5,214,605
DATED : May 25, 1993
INVENTOR(S) : Hyeong-Gyu Lim, et al

It is certified that error appears in the above-indentified patent and that said Letters Patent is hereby corrected as shown below:

IN THE CLAIMS

Claim 20  Column 14, Line 21, change "chains" to --drains--:

Signed and Sealed this

Twenty-ninth Day of April, 1997

*Attest:*

BRUCE LEHMAN

*Attesting Officer*  Commissioner of Patents and Trademarks